US005804255A

United States Patent [19]

Kiuchi et al.

[11] Patent Number: 5,804,255

[45] Date of Patent: Sep. 8, 1998

[54] METHOD OF FORMING TRANSPARENT AND CONDUCTIVE ULTRATHIN FILMS

[75] Inventors: Masato Kiuchi, Nara; Akiyoshi Chayahara, Ikeda, both of Japan

[73] Assignee: Agency of Industrial Science and Technology, Tokyo, Japan

[21] Appl. No.: 608,673

[22] Filed: Feb. 29, 1996

Related U.S. Application Data

[62] Division of Ser. No. 284,189, Aug. 2, 1994, abandoned.

[30] Foreign Application Priority Data

Aug. 2, 1993 [JP] Japan .................................... 5-210929

[51] Int. Cl.$^{6}$ ................................ B05D 3/06; B05D 5/06

[52] U.S. Cl. .......................... 427/530; 427/109; 427/166; 427/126.1; 427/126.2; 427/249

[58] Field of Search .................................... 427/534, 530, 427/535, 536, 537, 553, 554, 307, 309, 126.1, 126.2, 109, 166, 249, 595, 596, 597, 576

[56] References Cited

U.S. PATENT DOCUMENTS

| | | | |
|---|---|---|---|
| 4,109,052 | 8/1978 | Anderson . | |
| 4,320,169 | 3/1982 | Yatabe et al. . | |
| 4,634,600 | 1/1987 | Shimizu et al. | 427/38 |
| 4,719,152 | 1/1988 | Ohta et al. . | |
| 4,886,681 | 12/1989 | Clabes et al. . | |
| 4,971,853 | 11/1990 | Chaiken et al. | 428/172 |
| 5,064,520 | 11/1991 | Miyake et al. | 204/192.11 |
| 5,508,066 | 4/1996 | Akahori | 427/571 |

FOREIGN PATENT DOCUMENTS

| | | |
|---|---|---|
| 61-220417 | 9/1986 | Japan . |
| 6-102401 | 4/1994 | Japan . |
| 1307642 | 4/1970 | United Kingdom . |

OTHER PUBLICATIONS

Pierson, "Handbook of Chemical Vapor Deposition (CVD) Principles, Technology and Applications", Noyes Publications 1992, pp. 330–332.

Thin Solid Film, vol. 100 (1983) Feb.,No. 3, Lausanne, Switerland, B. Goranchev, et al. pp. 257–269.

*Primary Examiner*—Roy V. King

*Attorney, Agent, or Firm*—Knobbe, Martens Olson & Bear, LLP

[57] ABSTRACT

The invention provides a method of producing tranparent and conductive ultrathin films of metal carbide or metal nitride on a glass, ceramics or organic polymer substrate, which comprises the steps of exciting a surface of said substrate by irradiating said surface with a carbon or nitrogen ion beam; simultaneously vapor-depositing a transition metal onto said surface to form a carbide or nitride layer; and terminating the excitation and the vapor-deposition when the thickness of the metal carbide or nitride layer is in the range of 1 nm to 50 nm, and the light permeability of the metal carbide or nitride layer is in the range of 30% to 90%, wherein the conductivity of the metal carbide or nitride layer is in the range of 1 kΩ/□ To 100 kΩ/□.

1 Claim, No Drawings

METHOD OF FORMING TRANSPARENT AND CONDUCTIVE ULTRATHIN FILMS

RELATED APPLICATION

This application is divisional of U.S. application Ser. No. 08/284,189, filed Aug. 2, 1994, now abandoned.

FIELD OF THE INVENTION

The present invention relates to a transparent and conductive ultrathin film and a method of producing the same.

BACKGROUND OF THE INVENTION

Transparent and conductive ultrathin films are widely used as electrodes in display devices in which a liquid crystal composition is used, or as electric heating elements in demisters for glass panels, etc.

It is generally required that said transparent and conductive ultrathin films have transparency and conductivity as fundamental characteristics. Therefore, tin oxide, indium oxide and like substances having the said characteristics have so far been used as raw materials for the above-mentioned thin films.

However, tin oxide and the like are subject to corrosion and, therefore, thin films made thereof are lacking in environment resistance. Thus, said films cannot be used in locations exposed to the open air, hence they are of very narrow application.

SUMMARY OF THE INVENTION

It is a primary object of the invention to provide transparent and conductive ultrathin films having good environment resistance, in particular.

The present invention relates to a transparent and conductive ultrathin film comprising a transition metal, as formed on a substrate, with a film thickness of 1 to 200 nm and to a method of producing transparent and conductive ultrathin films which comprises vapor-depositing at least one vaporized transition metal on a substrate in excited state under vacuum to thereby form a thin film made of said transition metal.

DETAILED DESCRIPTION OF THE INVENTION

The present inventors found that a particular thin film prepared by vapor-depositing at least one vaporized transition metal on a substrate in excited state under vacuum has not only good transparency and conductivity but also suitable environment resistance. Based on this finding, the present invention has been completed.

The substrate on which the transparent and conductive ultrathin film is formed is not limited to any particular species but may be any transparent material generally having a light permeability of about 10 to 100%, preferably 50 to 100%. The "light permeability" so referred to herein is determined based on the permeability of visible light. As materials having such characteristic, there may be mentioned glass, ceramics and organic polymers.

The above-mentioned glass includes oxide glass species. In particular, silicate glass, borosilicate glass, alkali glass and the like are preferred. As the ceramics, there may be mentioned crystalline oxides. In particular, alumina, magnesia, zirconia and the like are preferred. The organic polymers include polyimides, polyethylene and polyvinyl resins. Methacrylic resins, polyimide resins and the like are especially preferred. Among the materials mentioned, borosilicate glass and the like are most preferable. In cases where the product ultrathin films are to be used in certain fields where transparency is not an essential requirement, for example, in the case of antistatic films, the substrate may be not transparent.

The transparent and conductive ultrathin film formed on the substrate comprises a transition metal. As the transition metal, substantially all transition metal species can be used. Preferred are titanium, vanadium, chromium, manganese, iron, cobalt, nickel, zirconium, niobium, molybdenum, rhodium, palladium, silver, hafnium, tantalum, tungsten, iridium, platinum, gold, lanthanide metals and actinide metals. More preferred are titanium and gold. The thin film generally has a thickness of about 1 to 200 nm, preferably about 1 to 30 nm. If the film thickness is below 1 nm, the conductivity may be lost. A thickness above 200 nm may unfavorably lead to loss of transparency.

The transparent and conductive ultrathin film of the invention mostly has an amorphous structure. Depending on the composition of the thin film, the production conditions and so forth, increased proportion of the crystalline phase may be obtained but will not substantially affect the characteristics of the thin film. Generally, the thin film has a light permeability of about 30 to 90% and a conductivity of about 1 to 100 kΩ/□. The film has environment resistance at least such that it never loses its function upon immersion in acidic aqueous solutions or spraying with brine.

The production method according to the invention is now described below. First, the substrate surface on which the thin film is to be formed is exposed to exciting conditions. If the transition metal is deposited from the vapor phase without exciting the substrate, the transition metal will aggregate in the form of insular crystals and thus fail to form a continuous film structure, hence fail to provide conductivity. Moreover, such insular crystals readily react with atmospheric oxygen to form oxides. As a result, the desired characteristics can never be obtained.

For exciting the substrate surface, the substrate is irradiated, in the conventional manner, with an ion beam, a plasma, an electron beam or a laser beam, either alone or in combination. The irradiation conditions may appropriately be selected according to the substrate employed, the transition metal selected, the desired film thickness and other factors. The term "excited state" as used herein generally means those state that the substrate surface has more thermokinetic energy or more internal energy as compared with the state before irradiation with the exciting source.

When the ion beam technique is employed in practicing the method of the invention, at least one ion beam selected from the group consisting of inert gas (e.g. helium, neon, argon, krypton) ion beams and carbon, nitrogen and oxygen ion beams. In particular, when a carbon or nitrogen ion beam is used, the transition metal is converted to a carbide or nitride, whereby the environment resistance of the thin film can be further improved. Electrons may be incorporated into an ion beam to render the combined beam electrically neutral or negative. The ion beam accelerating potential is generally about 10 V or higher.

When the plasma technique is employed, the plasma-jet excitation conditions already known in the art can be applied without any particular modification. Thus, for instance, the high frequency technique or direct current technique may be employed.

In the case of laser beam excitation as well, any of the techniques known in the art can be applied. Thus, for example, the substrate surface can be excited, using a YAG laser, a carbon dioxide laser, or an excimer laser.

While the substrate surface is excited, the vaporized transition metal is allowed to deposit on the substrate surface to form a transparent and conductive ultrathin film. For the vapor deposition, any of the techniques known in the art can be applied, for example the technique of vacuum vapor deposition, laser abrasion, ion plating, ion beam deposition, or CVD (chemical vapor deposition). In the practice of the invention, it is also possible to promote or accelerate the thin film formation by introducing a reactive gas, such as nitrogen or methane, into the vacuum in the step of thin film formation.

In accordance with the transparent and conductive ultrathin film production method of the invention, the vaporized transition metal is deposited on the substrate excited under vacuum, whereby thin films having properties distinct from those of the prior art metal oxide-based thin films can be obtained.

The transparent and conductive ultrathin film of the present invention is thus a very thin film comprising a transition metal and having a thickness of 1 to 200 nm and therefore has excellent transparency and conductivity as well as excellent environment resistance. Said thin film will not readily undergo oxidation or corrosion by salt but can maintain its excellent transparency and conductivity during use thereof.

Furthermore, the adhesion of the above thin film to the substrate is firm and the thin film has excellent smoothness. As a result, even when the uppermost surface of the thin film is eventually oxidized, the oxidation cannot advance any more toward the inside. The uppermost surface oxidation will not reduce the environment resistance, transparency or conductivity.

When a carbide or nitride is formed by carrying out the method of the invention, thin films having better oxidation resistance can be obtained.

The transparent and conductive ultrathin film of the present invention that has such characteristics can be used in a much wider range of application as compared with the prior art thin films. Thus, it is useful not only as an electrode material in liquid crystal display devices and as a demister heating element but also in the field of antistatic coating of cathode-ray tubes which are exposed to the air.

EXAMPLES

The following Examples and Comparative Examples are further illustrative of the characteristic features of the present invention.

In the examples, the environment resistance evaluation was carried out by spraying with a 0.5% aqueous solution of sodium chloride for 1 hour. When the reduction in transparency and in conductivity after spraying was not more than 10%, the environment resistance was judged good. When the above-mentioned reductions were within the measurement error range, an immersion test was further conducted in 0.1N hydrochloric acid. When the reductions in question were within the measurement error range, the environment resistance was judged very good.

Example 1

A molten quartz-derived substrate was irradiated, under vacuum, with a nitrogen ion beam. The ion beam accelerating voltage was 10 kV, and the ion beam current density was 0.1 mA/cm$^2$. Simultaneously with the ion beam irradiation, titanium was vapor-deposited on the substrate by the electron beam heating method. The rate of vapor deposition was 0.5 nm per second, the vapor deposition time was 20 seconds, and the vapor-deposited film thickness was 10 nm.

The titanium-containing thin film thus obtained had a surface resistivity of 5 Ω/□, proving to be conductive. The light permeability of the film was 85%. It was thus proved that said thin film was a transparent and conductive one. On the other hand, the thin film was subjected to the aqueous sodium chloride solution spraying test and hydrochloric acid immersion test, whereupon no changes were noted with respect to transparency and conductivity. The thin film thus proved to have very good environment resistance.

For evaluating the adhesion of the above thin film, an epoxy resin was applied to the thin film, to bond thereto a stud having a flat top with a diameter of 3 mm perpendicularly to the substrate. The stud was pulled in a direction perpendicular to the substrate. A pulling force of 3N failed to cause peeling of the thin film.

Further, the surface roughness of the above thin film was examined under an atomic force microscope and found to be not more than 2 nm. The thin film was thus found to be excellent in smoothness.

Comparative Example 1

Without substrate excitation, a titanium nitride thin film was vapor-deposited by feeding titanium onto a quartz substrate at a nitrogen partial pressure of $5\times10^{-5}$ Torr and a vapor deposition rate of 0.5 nm/sec for 40 seconds.

Examination of the sample thus obtained revealed an insular crystal structure. No conductivity was observed. When allowed to stand in the open air for 1 day, the thin film was oxidized to give titanium oxide. This results indicate that thin films having the desired characteristics can not be obtained when the deposition of the transition metal is conducted without simultaneous substrate excitation.

Example 2

An aluminum oxide single crystal substrate was irradiated, under vacuum, with a carbon ion beam. The ion beam accelerating voltage was 10 kV, and the ion beam current density was 0.1 mA/cm$^2$. Simultaneously with the ion beam irradiation, vanadium was vapor-deposited on the substrate by the electron beam heating method. The rate of deposition was 1 nm per second, the deposition time was 20 seconds, and the deposited film thickness was 20 nm. On that occasion, the substrate was simultaneously irradiated with an excimer laser beam at 50 mJ and 100 Hz.

The vanadium-containing thin film thus obtained had a surface resistivity of 6 kΩ/□, proving to be conductive. The light permeability of the film was 75%. It was thus proved that said thin film was a transparent and conductive one. Further, the above thin film was subjected to the aqueous sodium chloride solution spraying test and hydrochloric acid immersion test, whereupon no changes were noted with respect to transparency and conductivity. The thin film thus proved to have very good environment resistance.

Example 3

A transparent acrylic resin plate substrate was irradiated, under vacuum, with a carbon and hydrogen ion beams. The ion beam accelerating voltage was 10 kV and the ion beam current density was 0.01 mA/cm$^2$. Simultaneously with the ion beam irradiation, gold was vapor-deposited on the substrate by the electron beam heating method. The rate of deposition was 0.1 nm per second, the deposition time was 100 seconds and the deposited film thickness was 10 nm.

The gold-containing thin film thus obtained had a surface resistivity of 1 kΩ/□, proving to be conductive. The light permeability of the film was 70%. It was thus proved that said thin film was a transparent and conductive one. The above thin film was subjected to the aqueous sodium chloride solution spraying test and hydrochloric acid immersion test, whereupon no changes were noted with respect to transparency and conductivity. The thin film thus proved to have very good environment resistance.

Example 4

A magnesium oxide substrate was irradiated, under vacuum, with a YAG laser beam at an intensity of 100 mW. Simultaneously with the laser irradiation, zirconium was vapor-deposited on the substrate by the electron beam heating method. The rate of deposition was 0.5 nm per second, the deposition time was 100 seconds, and the deposited film thickness was 50 nm. Throughout the vapor deposition process, gaseous nitrogen was introduced into the vacuum container to maintain a nitrogen pressure of $1\times10^{-4}$ Torr.

The zirconium nitride thin film thus obtained had a surface resistivity of 3 kΩ/□, proving to be conductive. The light permeability of the film was 60%. It was thus proved that said thin film was a transparent and conductive one. The above thin film was subjected to the aqueous sodium chloride solution spraying test, whereupon no changes were noted with respect to transparency and conductivity. The thin film thus proved to have good environment resistance.

Example 5

A borosilicate glass substrate was irradiated, under vacuum, with argon ions accelerated at 10 kV, at a current density of 0.05 mA/cm$^2$. Simultaneously with the ion beam irradiation, hafnium was vapor-deposited on the substrate by the electron beam heating method. The rate of deposition was 0.5 nm per second, the deposition time was 100 seconds, and the deposited film thickness was 50 nm. In this process, the pressure of the processing chamber was $1\times10^{-4}$ Torr, of which $1\times10^{-5}$ Torr was a partial pressure resulting from introduction of nitrogen.

The hafnium nitride thin film thus obtained had a surface resistivity of 10 kΩ/□, proving to be conductive. The light permeability of the film was 55%. It was thus proved that said thin film was a transparent and conductive one. Further, the above thin film was subjected to the aqueous sodium chloride solution spraying test, whereupon no changes were noted with respect to transparency and conductivity. The thin film thus proved to have good environment resistance.

Example 6

An alkali glass substrate was irradiated, under vacuum, with helium ions accelerated at 20 kV at a current density of 0.1 mA/cm$^2$. Simultaneously with the ion beam irradiation, tungsten was vapor-deposited on the substrate by the electron beam heating method. The rate of deposition was 0.2 nm per second, the deposition time was 100 seconds, and the deposited film thickness was 20 nm. In this process, the pressure of the processing chamber was $1\times10^{-4}$ Torr, of which $1\times10^{-5}$ Torr was a partial pressure resulting from introduction of gaseous methane.

The tungsten carbide thin film thus obtained had a surface resistivity of 40 kΩ/□, proving to be conductive. The light permeability of the film was 70%. It was thus proved that said thin film was a transparent and conductive one. Further, the above thin film was subjected to the aqueous sodium chloride solution spraying test, whereupon no changes were noted with respect to transparency and conductivity. The thin film thus proved to have good environment resistance.

We claim:

1. A method of producing a transparent and conductive ultrathin metal carbide or nitride layer deposited on a substrate selected from the group consisting of glass, ceramics and organic polymers, each having a light permeability of 50% to 100%, which comprises the steps of:

exciting a surface of said substrate by irradiating said surface with an excitation source under a vacuum, said excitation source being a carbon ion beam or a nitrogen ion beam;

vapor-depositing a transition metal on said surface of said substrate simultaneously with the excitation of said surface to thereby form a thin layer of said transition metal on said substrate;

converting said transition metal to a carbide or a nitride with the excitation during the vapor-deposition; and terminating the excitation and the vapor-deposition when the thickness of the metal carbide or nitride layer is in the range of 1 nm to 50 nm, and the light permeability of the metal carbide or nitride layer is in the range of 30% to 90%, wherein the conductivity of the metal carbide or nitride layer is in the range of 1 kΩ/□ to 100 kΩ/□.

* * * * *